United States Patent [19]

Manome et al.

[11] Patent Number: 4,608,657

[45] Date of Patent: Aug. 26, 1986

[54] METHOD AND APPARATUS FOR TESTING PROBE CALIBRATION

[75] Inventors: Teruo Manome, Kanagawa; Yasuhiko Miki, Tokyo; Kentaro Takita, Tokyo; Minoru Fukuta, Tokyo, all of Japan

[73] Assignee: Sony/Tektronix Corporation, Tokyo, Japan

[21] Appl. No.: 438,101

[22] Filed: Nov. 1, 1982

[30] Foreign Application Priority Data

Nov. 17, 1981 [JP] Japan .................................. 56-184095

[51] Int. Cl.⁴ ........................ G06F 15/20; G01R 35/00
[52] U.S. Cl. ............................... 364/571; 324/57 PS; 364/579
[58] Field of Search ............ 328/162, 148; 324/57 R, 324/57 PS; 307/360; 364/571, 579, 580

[56] References Cited

U.S. PATENT DOCUMENTS

| | | |
|---|---|---|
| 3,800,236 | 3/1974 | Riethmuller et al. ............... 328/162 |
| 4,070,615 | 1/1978 | Crop ................................. 324/57 R |
| 4,161,029 | 6/1979 | Frye et al. .......................... 364/579 |
| 4,229,703 | 10/1980 | Bustin ............................... 328/162 |
| 4,253,057 | 2/1981 | Carlton et al. .................. 324/57 PS |
| 4,458,196 | 7/1984 | Goyal et al. .................... 324/57 PS |

Primary Examiner—Felix D. Gruber
Attorney, Agent, or Firm—Dellett, Smith-Hill & Bedell

[57] ABSTRACT

In a method for testing for probe calibration, a square-wave signal is applied to a probe and a cyclic probe output signal resulting therefrom is compared to a reference level at a plurality of points along one cycle of the output signal. The reference signal is iteratively increased or decreased until it is less than or greater than a minimum or maximum peak magnitude of the probe output signal by a small amount. The probe is then determined to be calibrated according whether the magnitude of the output signal at each point is greater than or less than the reference level.

22 Claims, 18 Drawing Figures

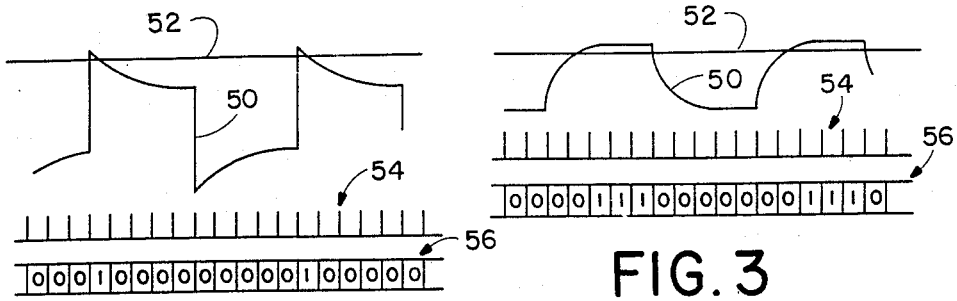
FIG. 2
FIG. 3
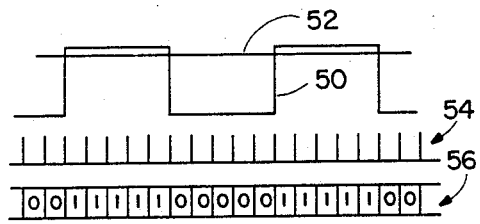
FIG. 4
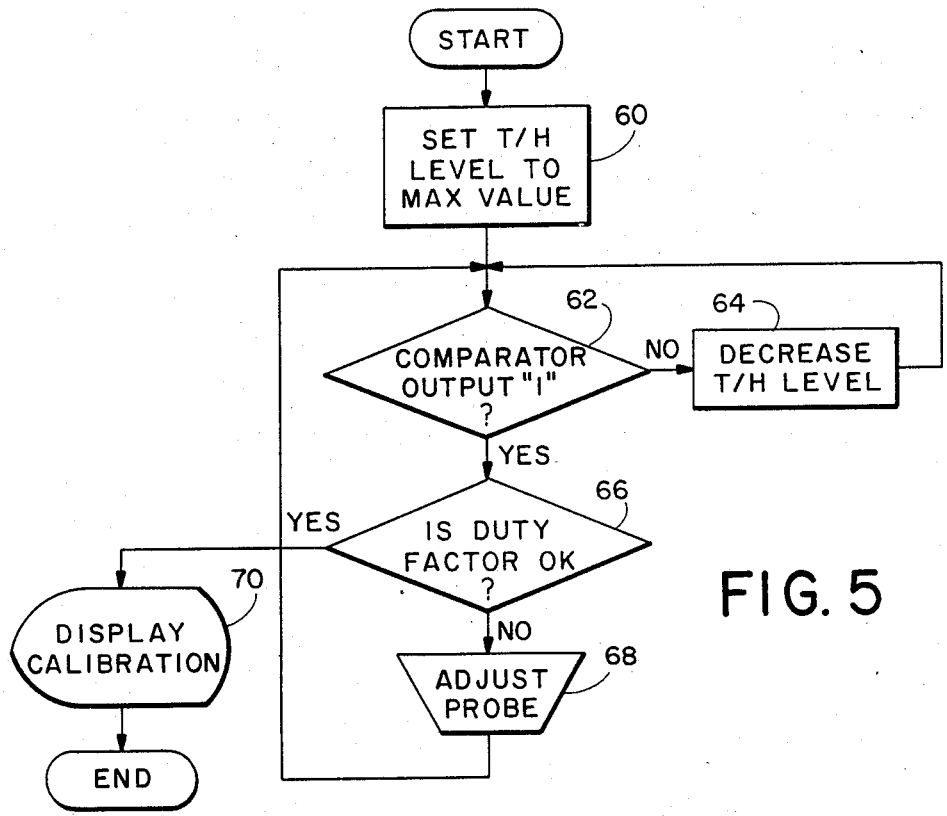
FIG. 5

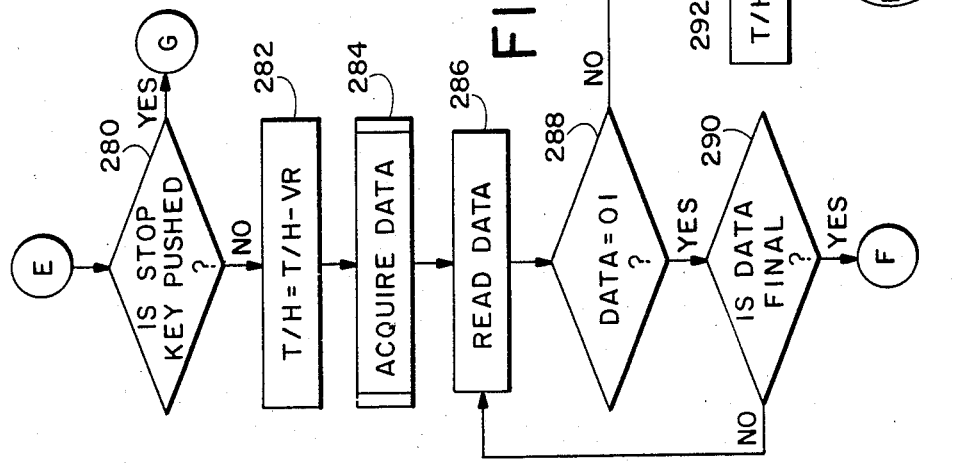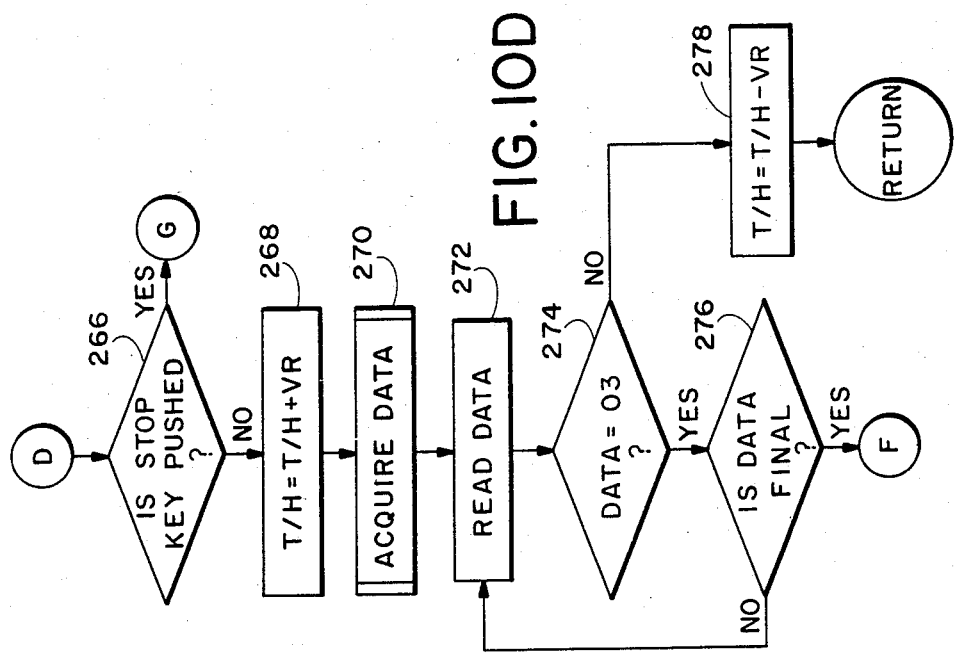

METHOD AND APPARATUS FOR TESTING PROBE CALIBRATION

BACKGROUND OF THE INVENTION

The present invention relates generally to electronic signal probes and more specifically to a method and apparatus for testing whether or not a probe has been calibrated.

Electronic measurement apparatus for measuring various characteristics of an input signal, including oscilloscopes, frequency counters, digital multimeters (DMMs), logic analyzers, or the like, receive input signals in various frequency bands through voltage attenuation probes. The input impedance associated therewith results from the input impedance of the electronic measurement apparatus. It is necessary to calibrate the attenuation probe so as to minimize signal waveform distortion caused by the probe when the signal is accessed by the probe. To this end, according to one method of the prior art, a calibration square-wave signal from a calibration generator is applied to the probe, and the output signal waveform from the probe is observed with the oscilloscope. When the output signal waveform is a correct square-wave, the probe is determined to be calibrated. When the output signal waveform from the probe is not the correct square-wave, the probe calibration is adjusted while observing the waveform with the oscilloscope. Since many electronic measurement devices do not have an oscilloscope function associated therewith, a separate oscilloscope is needed to check the probe calibration. As a result, probe calibration is troublesome and expensive.

Other conventional methods have been developed to determine whether or not an attenuation probe is calibrated without the use of an oscilloscope. One such conventional method of testing probe calibration is disclosed in Japanese Published Unexamined Patent Application No. 52-137954 corresponding to U.S. Pat. No. 4,070,615. According to this method, a square-wave signal is applied to the probe and to one input terminal of a differential amplifier, the output signal from the probe being applied to another input terminal of the amplifier. An output signal from the differential amplifier is then smoothed and applied to a light emitting diode (LED). An operator may ascertain that the probe is calibrated when the brightness of the LED is at a maximum. However, the method is limited in accuracy because it is difficult to make a very accurate determination of maximum brightness.

Another conventional method of testing probe calibration is disclosed in Japanese Published Unexamined Patent Application No. 55-147368, corresponding to U.S. Pat. No. 4,253,057, wherein a square-wave is applied to an under-compensated probe and a reference level is set just above the peak level of a resulting probe output signal. The probe is then adjusted toward over-compensation until the output level exceeds the reference level, as determined by a comparator having an output which drives an indicating lamp. This method has a disadvantage in that the operator must know whether the probe is in an under-compensation (undershoot) condition or in an over-compensation (overshoot) condition before calibration, since calibration must be started when in the under-compensation state. Another disadvantage of the method is that the operator cannot determine whether or not the probe is calibrated without first modifying it.

SUMMARY OF THE INVENTION

According to the present invention, an attenuation probe receives a square-wave signal having known characteristics, including amplitude, frequency and duty factors. A comparator compares the resulting probe output signal with a threshold level which is substantially equal to the maximum or minimum peak value of the probe output signal. When the probe output signal exceeds the threshold level at any point, the output signal from the comparator is, for example, a high level (logic "1"), and when the probe output signal does not exceed the threshold level, the comparator output is, for example, a low level (logic "0"). A central processing unit (CPU) determines whether or not the probe is calibrated in accordance with a sequence of output signal states from the comparator stored in an acquisition memory corresponding to a plurality of points along one cycle of the waveform.

In a first preferred embodiment of the present invention, the threshold level is iteratively adjusted to be slightly lower than the maximum peak value of the probe output signal or to be slightly higher than the minimum peak value of the probe output signal. The CPU then counts the logic "1" and "0" output signals generated by the comparator, calculates a duty factor according to a ratio thereof, and compares the calculated duty factor with the known duty factor of the square-wave. If the duty factors are equal, the probe is determined to be calibrated.

In a second preferred embodiment of the present invention, the threshold level is adjusted to first and second levels which are slightly higher and lower than the peak value of the probe output and the CPU reads the resulting output signals from the comparator. If one of the first and second threshold levels exceeds the probe output for all sample points along one cycle of the output waveform and the other one does not exceed the probe output for any sample points, the CPU determines that the probe is calibrated. Otherwise, the CPU determines that the probe is in an under-compensation or in an over-compensation state according to the bit pattern produced by the comparator.

The calibration state of the probe as determined by the CPU is indicated on a display device such as a cathode-ray tube, LED, or liquid crystal display controlled by the CPU, so that the operator can calibrate the probe by observing the display device.

It is therefore one object of the present invention to provide an improved method of testing the calibration of a probe without using an oscilloscope.

It is another object of the present invention to provide an improved method for determining whether a probe is properly compensated, under-compensated or over-compensated.

It is a further object of the present invention to provide an improved apparatus for determining whether a probe is calibrated or not.

Other objects, advantages, and features of the present invention will become apparent to those having ordinary skill in the art from a reading of the following detailed description when taken in conjunction with the accompanying drawings.

BRIEF DESCRIPTION OF THE DRAWINGS

FIG. 2 depicts an over-compensated probe output waveform;

FIG. 3 depicts an under-compensated probe output waveform;

FIG. 4 depicts a correctly compensated probe output waveform;

FIG. 5 is a flow chart for explaining the first preferred embodiment of the present invention;

FIG. 10A through 10G are detailed flow charts relating to the second embodiment according to the present invention;

DETAILED DESCRIPTION OF THE INVENTION

Figure 1:
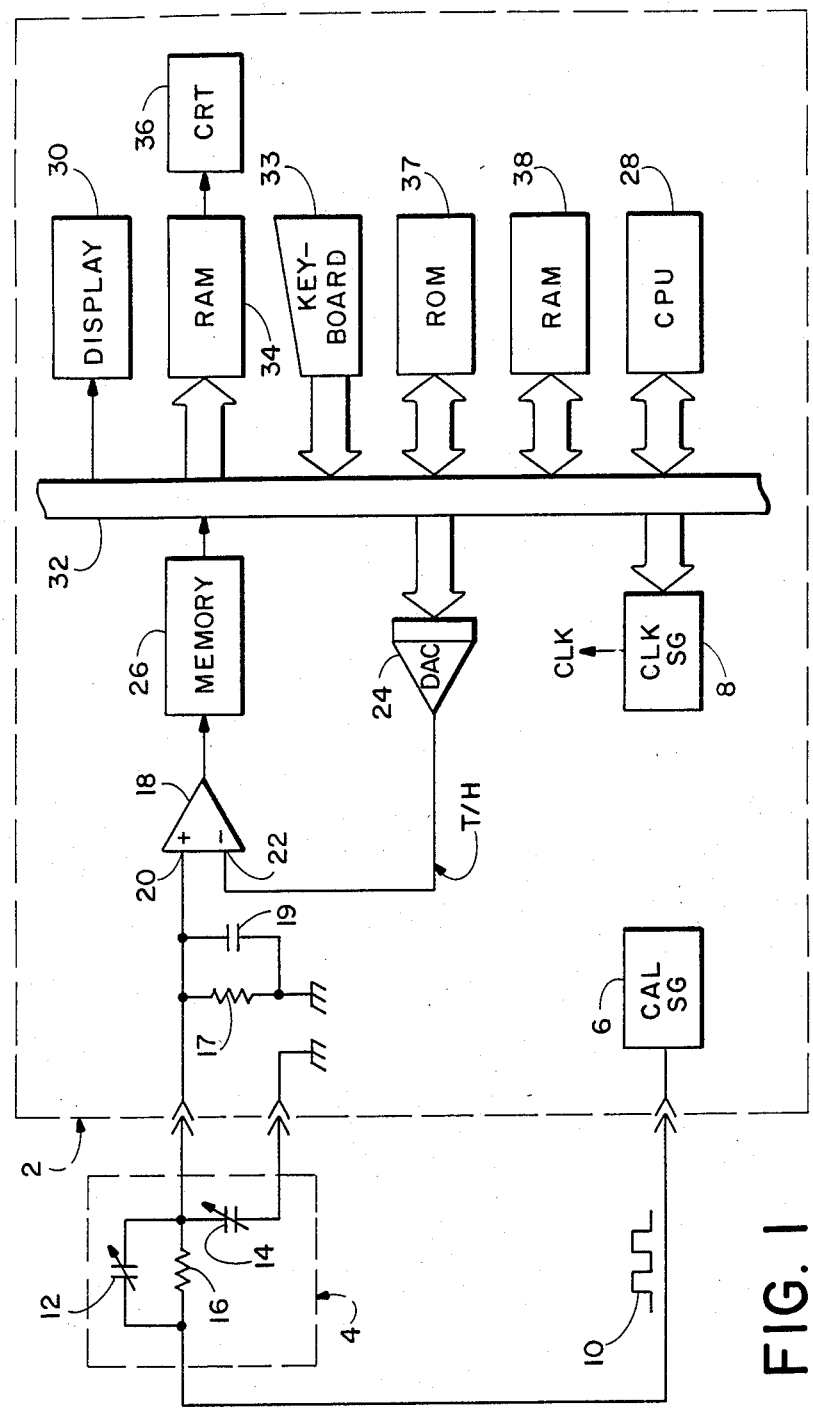
FIG. 1 is a block diagram of an electrical measurement apparatus and a probe employed according to a first preferred embodiment of the present invention.

Referring now to FIG. 1, there is shown a block diagram of an electrical measurement apparatus and a probe employed according to a first preferred embodiment of the present invention. A block indicated by a numeral 2 is a logic analyzer, an example of a measurement apparatus. Numeral 4 indicates an attenuation probe to be calibrated. A calibration reference signal generator 6 generates a square-wave signal 10, the pulse width of which is determined by the frequency of a clock signal from a clock signal generator 8.

The probe 4, which receives the square-wave signal 10 from the calibration signal generator 6, consists of variable capacitors 12 and 14, and a resistor 16 connected in parallel with the variable capacitor 12. A common junction of the variable capacitor 12 and the resistor 16, at the probe tip, is connected to the calibration signal generator 6, while the other junction of the variable capacitor 12 and the resistor 16 is connected to ground (a common reference voltage source) through the variable capacitor 14, and is directly connected to a non-inverting input terminal 20 of a comparator 18. A parallel circuit consisting of a resistor 17 and a capacitor 19, inserted between the non-inverting input terminal 20 and ground, substantially determines the input impedance of the logic analyzer 2. It should be noted that this input impedance and probe 4 form a voltage divider.

The non-inverting input terminal 20 of the comparator 18 receives the output signal from the probe 4, while an inverting input terminal 22 of the comparator receives a threshold voltage (reference signal level) from digital-to-analog converter (DAC) 24. Comparator 18 compares the signal at the non-inverting input terminal 20 with the voltage at the inverting input terminal 22, and the comparison result is represented as a binary signal ("0" and "1"). The output digital signal state of the comparator 18 is stored as a bit in an acquisition memory 26 each time the memory is write strobed by the clock signal from the clock signal generator 8. As described hereinafter, the resulting sequence of bits stored in the acquisition memory 26 is processed by a central processing unit (CPU) 28, and a display device 30 indicates to the operator whether or not probe 4 is calibrated.

The CPU 28 may suitably comprise an Intel 8080 microprocessor or a Zilog Z80A microprocessor. The 8080 microprocessor is fully described in "MCS-80 User's Manual" published by Intel, and the Z80A microprocessor is fully described in "Z80/Z80A CPU Technical Manual" and in the "Z8400, Z80 CPU Product Specification" published by Zilog.

A bus 32 consisting of data, address and control lines, is connected to a keyboard 33 as an input device, to a read only memory (ROM) 37 storing programs, to a random access memory (RAM) 38 for providing auxiliary memory for the CPU 28, to the clock signal generator 8, to the DAC 24, to the acquisition memory 26, to the display means 30, and to a display RAM 34 for controlling a cathode-ray tube (CRT) display device 36. The acquisition frequency of the memory 26 is much higher than the frequency of the square-wave signal 10 from the calibration signal generator 6 (for example, ten times higher). The clock signal frequency from the clock signal generator 8 is divided as appropriate and applied to each clocked device in FIG. 1. The logic analyzer 2 suitably includes a conventional trigger circuit (not shown in FIG. 1) which generates a trigger signal in accordance with the input signal from the probe so as to control the acqustion of the memory 26.

A first preferred embodiment of the present invention will be discussed in conjunction with the waveforms depicted in FIGS. 2 through 4, and the flow chart of FIG. 5. The CPU 28 controls the DAC 24, the acquisition memory 26 and the display device, and processes the digital signal stored in the acquisition memory 26 in accordance with the program in the ROM 37. Initially, the CPU 28 adjusts the DAC 24 so that it generates the highest possible threshold (T/H) level in a predetermined range (step 60 in FIG. 5), and the comparator 18 compares this threshold sample level with the output signal from the probe 4. Since the threshold level from the DAC 24 is higher than the output signal from the probe 4, i.e., the threshold level does not intersect the probe output level, the output signal from the comparator 18 is determined to be continuously in a "0" logic state and logical "0" bits are sequentially stored in predetermined addresses of the acquisition memory 26, as it is write enabled by the clock pulses. The CPU 28 then reads the resulting bit sequence stored in the acquisition memory 26 and determines whether or not the sequence includes a logical "0" bit (step 62). Since initially the comparator 18 continuously produces a "0" level output, all bits in the sequence are 0's, and the CPU 28 causes the DAC 24 to decrease the threshold level by a predetermined small amount (step 64). The comparator 18 again compares the new threshold level with the output signal from the probe 4, and the comparison result bit sequence is stored in the acquisition memory 26. Program flow then returns to step 62. The above described operations are repeated until the comparator 18 generates at least one logical "1" output bit during a probe output signal 50 cycle. FIGS. 2, 3 and 4 indicate the timing relationship among the output signal 50 from the probe 4, the threshold level 52, the clock signal 54 and the contents 56 of the acquisition memory 26, when the comparator 18 initially generates "1", i.e., the threshold level 52 is slightly lower than the maximum peak value of the probe output signal.

A step 66 is next, wherein the CPU 28 calculates the duty factor of the comparator's output by counting the number of "1" or "0" bits stored during one cycle of the square-wave signal 10 and computing a ratio thereof to the total number of bits acquired during the cycle. The CPU 28 determines whether or not the calculated duty factor is equal to a predetermined value (the duty factor of the square-wave signal 10 from the calibration signal generator 6). (It should be noted that the characteristics (frequency, duty factor, amplitude) of the square-wave signal 10 are known and stored in the ROM 37.) If the probe output signal 50 is in an under-compensated or over-compensated state as shown in FIGS. 2 or 3, the calculated duty factor differs from the known duty factor for the square-wave. In this case, the probe 4 is not calibrated and a step 68 follows. If the probe output signal 50 is correctly compensated (i.e. calibrated) as shown in FIG. 4, the calculated duty factor is equal to the known duty factor, such as 0.5, and step 70 is next. In the step 70, the CPU 28 controls the display device 30 to indicate that the probe 4 is calibrated. The display device 30 may be an LED or liquid crystal display device.

An operator can calibrate an uncalibrated probe 4 by observing the display device 30. When the display device 30 does not indicate that the probe is properly calibrated, the operator may adjust the variable capacitors 12 and/or 14 of the probe 4 in step 68. Steps 62 through 68 are repeated until the probe 4 is calibrated. When the display device 30 is enabled in step 70, the operator must complete the adjustment of the probe 4.

In the above description, the threshold level from DAC 24 is decreased from the highest level of the threshold voltage range by steps of predetermined small value. However, the threshold level may alternatively be increased from the lowest level by steps of the predetermined value until the first "1" level output bit is detected. The duty cycles of probe output and input signals may be compared in a similar fashion to determine the probe calibration state.

It is possible to improve the accuracy of the test for probe calibration by making the ratio of the frequency of the square-wave signal 10 to the clock frequency (acquisition speed of the memory 26) large so as to increase the number of sample points per cycle and also be decreasing the incremental step size of the threshold level from the DAC 24.

Figure 6:
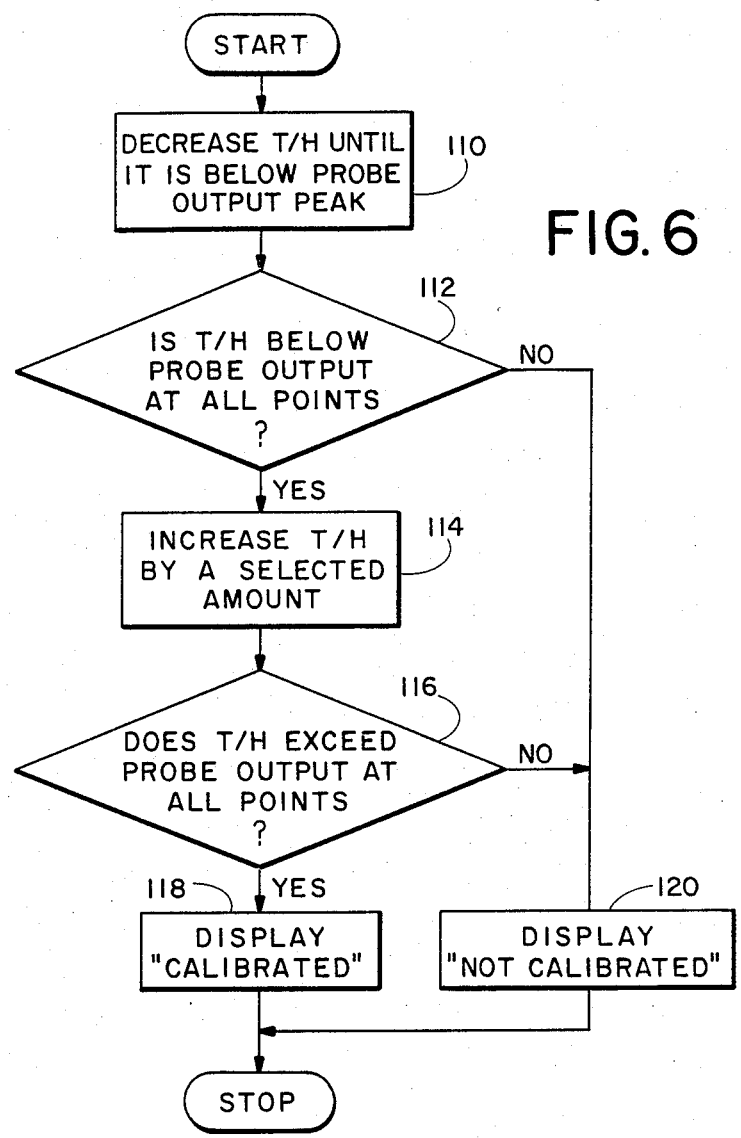
FIG. 6 is a flow chart for explaining a second preferred embodiment of the present invention.

FIG. 6 is a flow chart for explaining a second preferred embodiment of the present invention. Initially, the voltage attenuation probe is connected to the input terminal of the electrical measurement apparatus, such as a logic analyzer, and the square-wave signal is applied thereto through the probe. The following steps are then executed:

STEP 110: The threshold (T/H) level is set at the highest level of the range (see FIGS. 7A, B and C, wherein Vi is the probe output waveform), and the threshold level is decreased until it is less than the probe output signal at least at one sample point (see FIGS. 7D, E and F). Thus, the threshold level is adjusted to be slightly lower than the maximum peak value of the probe output waveform. This step is executed by applying a threshold level and the probe output signal to the inverting and non-inverting input terminals of the comparator and monitoring the resulting output bit sequences as the threshold level is lowered until at least one bit of a sequence appears in the high level "1" state as discussed in connection with step 62 of FIG. 5.

STEP 112: The threshold level is compared to the probe output signal generated in response to a high voltage level portion of one square-wave signal. If, as in FIG. 7D, at every sampling point during this period the probe output voltage exceeds the threshold level (i.e., every comparator output sequence bit is high), step 114 is followed. Otherwise, as in FIG. 7E or F, step 120 is followed.

Figure 7:
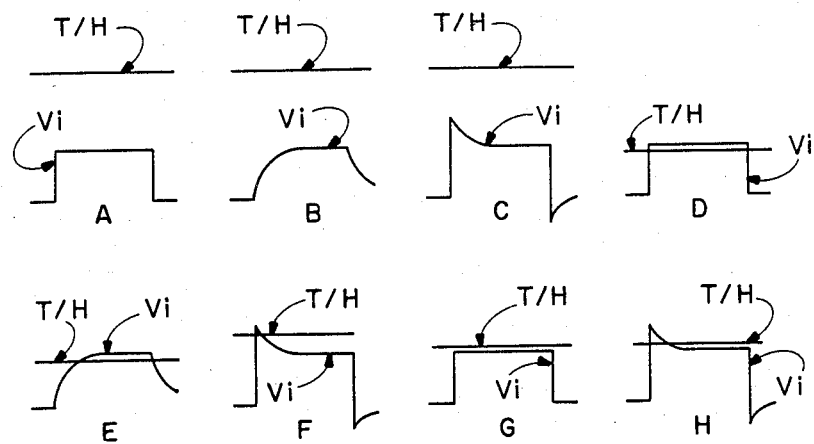
FIG. 7 illustrates a set of probe output waveforms for explaining the operation of the second embodiment according to the present invention.

STEP 114: The threshold level is adjusted upward by a small amount such that if the probe is properly calibrated to within an acceptable tolerance, the threshold level will exceed the probe output signal at every sample point (FIG. 7G).

STEP 116: The threshold level is checked to determine whether or not it totally exceeds the probe output signal. This step can be executed by observing that the output signal sequence bits from the comparator are all at a low level. According to steps 112-116, the probe calibration state is accurately determined by recognizing that the probe output signal is within a predetermined small range during the high level portion of the square-wave signal. If the determination result in step 116 is positive, i.e., the threshold level does exceed the probe output signal at every point, as shown in FIG. 7G, the probe is properly calibrated, and a step 118 followed. However, if after step 112 the operator has adjusted the variable capacitor so as to drive the probe into an over-compensated state (as shown in FIG. 7H) the result of step 116 is negative and step 120 is next.

STEP 118: The display device indicates that the probe is calibrated ("CALIBRATED").

STEP 120: The display device indicates that the probe is not calibrated ("NOT CALIBRATED").

Thus, the calibration condition of the probe is determined in steps 110-120. An operator may calibrate the probe by watching the displays produced during steps 118 and 120, adjusting the probe capacitors required, and then repeating the test procedure starting at step 110. In the above description, the threshold level is decreased from a level higher than the probe output signal in a step-by-step fashion. However, the threshold level may instead be progressively increased from a lower level than the probe output signal, with the comparisons corresponding to those of steps 112 and 116 being performed with respect to the low, rather than the high, level portion of the output waveform cycle.

Figure 8:
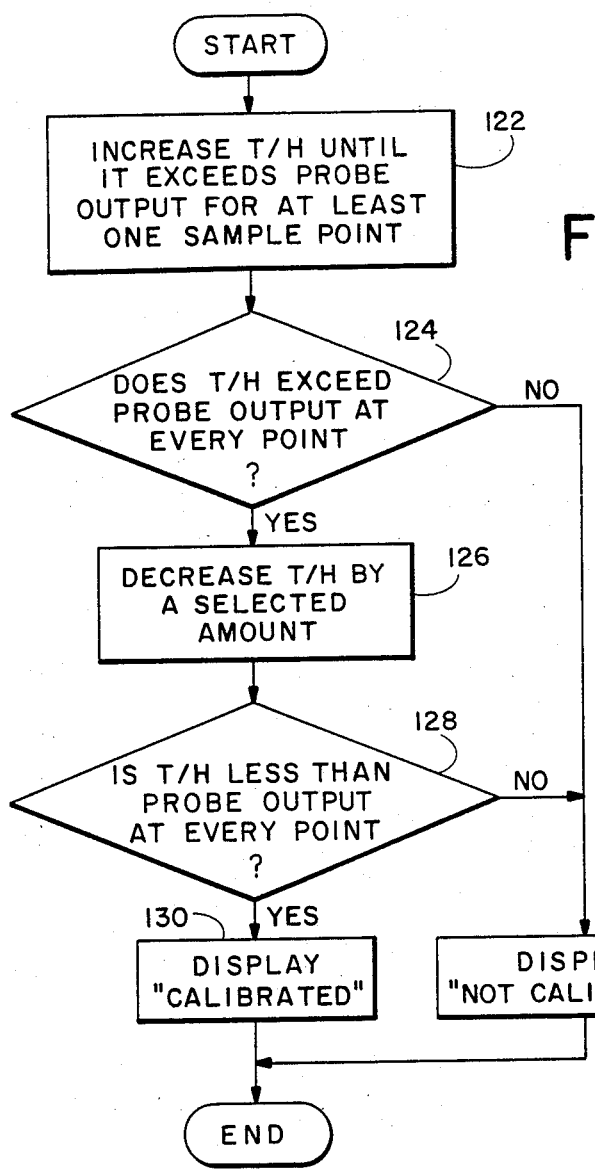
FIG. 8 is a flow chart for explaining a modification of the second embodiment according to the present invention.

FIG. 8 is a flow chart for explaining a modification of the second embodiment of the present invention. Referring to FIG. 8:

STEP 122: The threshold level is initially adjusted upward to exceed the probe output signal for at least one sample point during a high level portion of one output waveform cycle. For example, the threshold level may be set to the center level of the probe output signal and then iteratively increased until it exceeds the probe output signal at any sample point.

STEP 124: If the threshold level excees the probe output signal at every point, step 126 is followed. If the threshold level is less than the probe output signal for at least one sample point, a step 132 if followed. Step 124 can be executed by monitoring the output bit sequences from the comparator produced after each change in the threshold level.

STEP 126: The threshold is decreased by a selected amount. If the probe is properly calibrated to within acceptable tolerance, the probe output signal will exceed the reference level at every sampling point.

STEP 128: The probe output signal is compared to the threshold level. If the threshold level is less than the probe output at all sampling points, step 130 is selected. If not, the procedure enters step 132.

STEPS 130 and 132: These steps correspond to steps 118 and 120 of FIG. 6, respectively.

Thus in steps 122 and 132 it is determined whether or not the high level portion of the probe output signal is within a range bounded by two threshold levels. If the probe output signal is calibrated, every sample point will fall therebetween. If the probe signal is not calibrated, at least one probe signal sample point will lie outside the boundaries.

Figure 9:
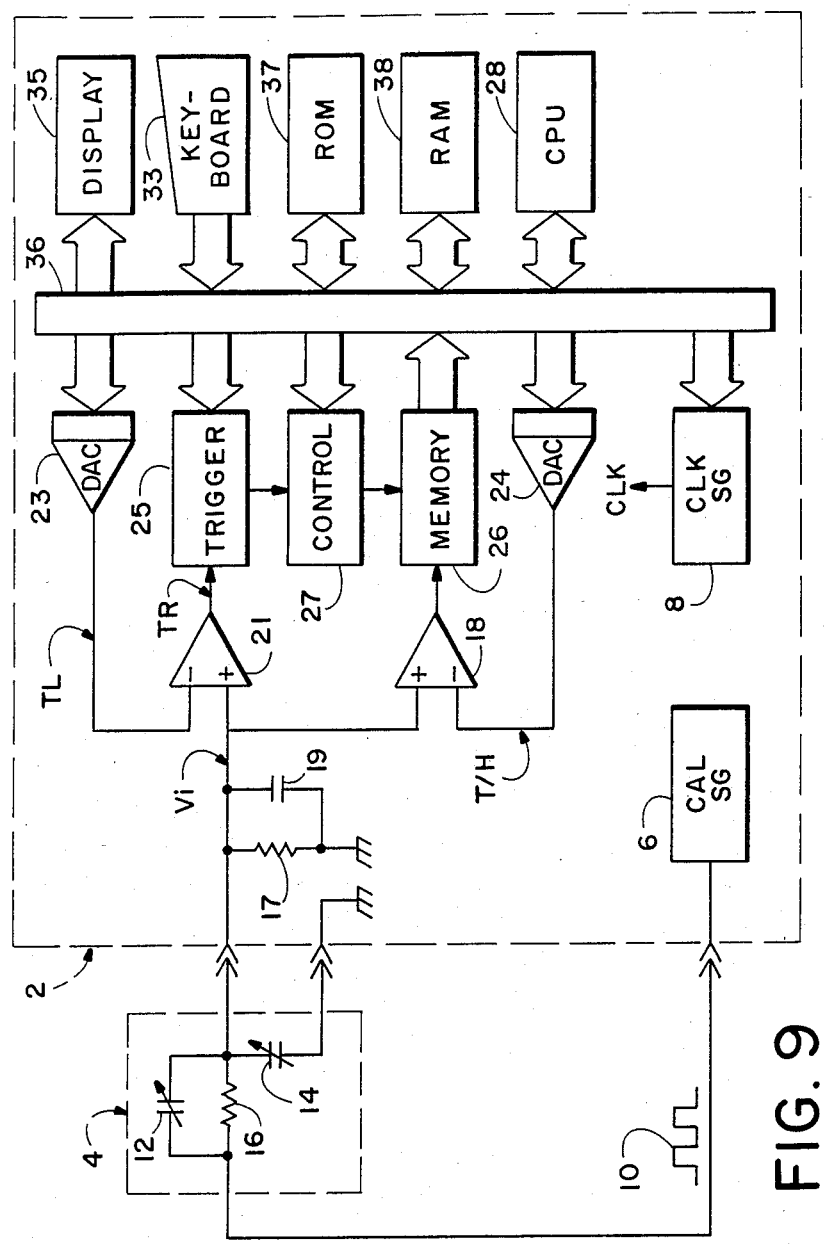
FIG. 9 is a block diagram of an electrical measurement apparatus and a probe employed according to the second embodiment of the present invention.

FIG. 9 is a block diagram of an electrical measurement apparatus and a probe using a second embodiment of the present invention, wherein the elctrical measurement apparatus is a logic analyzer. This block diagram is similar to that of FIG. 1, so that same reference numbers have been employed to designate like parts and only the differences will be discussed. The logic analyzer 2 includes a comparator 21, DAC 23, trigger circuit 25 and a control circuit 27 for the acquisition memory 26. Since the input impedances of comparators 18 and 21 are very high, the input impedance of logic analyzer 2 is substantially determined by a parallel circuit consisting of a resistor 17 and capacitor 19. The comparator 21 receives the probe output signal (Vi) and a trigger level (TL) from the DAC 23 at the non-inverting and inverting input terminals. The trigger circuit 25 selects a slope of a trigger signal TR from the comparator 21 and delays the trigger signal TR in accordance with a control signal from the bus 36. The control circuit 27 switches the acquisition memory 26 to a "write" mode in response to a control signal from the bus 36, and switches the acquisition memory 26 from the write mode to a read mode in response to an output signal from the trigger circuit 25. A display device 35 includes a CRT and a control circuit corresponding to blocks 30, 34 and 36 of FIG. 1. In a manner similar to the operation of the circuit of FIG. 1, the frequency and amplitude of the square-wave signal 10 from the calibration signal generator 6 are predetermined to be, for example, 1 kHz and 4 V, respectively.

A method of testing probe calibration as employed with the logic analyzer 2 of FIG. 9 will be discussed by reference to flow charts of FIGS. 10A through 10G. The method is based on the second embodiment of the present invention as shown in FIG. 6. When a probe calibration mode is selected, using the keyboards 33, CPU 28 executes the following steps in accordance with the program stored in ROM 37.

STEP 200: Various settings of data acquisition equipment controlled by the CPU 28 when operating in a data acquisition mode prior to a probe calibration mode are stored in the RAM 38 so that the prior mode may be resumed after completion of the probe calibration mode.

STEP 202: Various initial values are set for determining the probe calibration. For example, the threshold level T/H from the DAC 24 is set to a maximum value so as to exceed the probe output signal Vi (see FIGS. 7A, B and C). The trigger level TL from the DAC 23 is adjusted so as to exceed the lower level of the probe output signal Vi whereby the trigger signal TR is generated on the rising edge of the square-wave signal 10. For example, when the amplitude of a calibrated probe output waveform Vi is 400 mV, the trigger level TL may be adjusted to 140 mV. The trigger circuit 25, control circuit 27, and clock signal generator 8 are set so that the acquisition memory 26 acquires the output signal data sequence from the comparator 18 during a high level portion of one cycle of the square-wave signal 10. In other words, a post trigger data acquisition mode is selected.

Figure 10F:
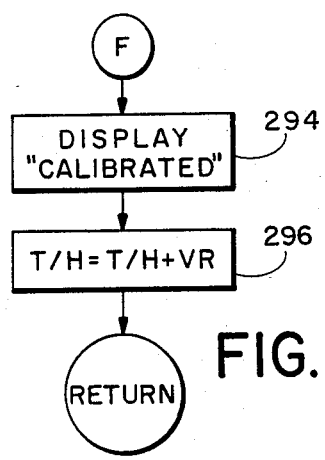
Figure 10G:
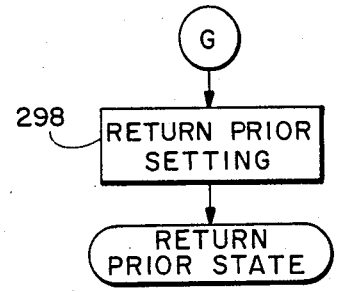

STEP 204: The CPU 28 determines whether or not a stop key of the keyboard 33 is pushed. If the key is pushed (YES), a completion routine G of FIG. 10G is followed. If the key is not pushed (NO), step 206 is followed.

STEP 206: The acquisition memory 26 stores a bit representing the state of the output signal from the comparator 18 on every clock signal CLK pulse generated between occurrence of the trigger signal TR and the next trailing edge of the square-wave signal. Thus, the acquisition memory 26 stores a sequence of bits indicating the relationship between the probe output signal and the threshold level at a sequence of sample points along the probe output signal during the high level period of the square-wave signal. The CPU can determine when the trailing edge of the square-wave signal has occurred because the duration of the high level portion of the square-wave signal, the clock frequency and the trigger position are known.

STEP 208: The CPU 28 reads a next bit of the data sequence corresponding to the high level period of the square-wave signal from the acquisition memory 26 on each execution of this step.

STEP 210: The CPU 28 determines whether or not the data bit read is high, i.e., whether or not the probe output signal exceeds the threshold level. The CPU 28 references the high bit condition as a code "01". If the bit is not high (NO), step 212 follows. If the bit is high (YES), step 218 is followed.

STEP 212: The CPU 28 determines whether or not the data bit read in step 208 is the final bit of the sequence corresponding to the high level period of the square-wave signal. If it is (YES), step 214 is entered. If it is not (NO), step 208 is repeated.

STEP 214: The DAC 24 is controlled to decrease the threshold level by a predetermined value VR, for example, 40 mV.

STEP 216: The CPU 28 determines whether or not the threshold level is lower than a predetermined lower limit VL (for example, 100 mV). If the result is YES or NO, steps 202 or 206 are followed, respectively. Step 216 prevents the CPU from running away.

As described hereinbefore, in steps 208–212 the CPU 28 determines whether or not the threshold level is less than the probe output signal at any sample point. If not, the threshold level is decreased by a predetermined small amount in step 214 and a new data sequence is stored in the acquisition memory 26 for determining whether or not the reduced threshold level is less than the probe output signal at any sample point. These steps are repeated until the threshold level is less than the probe output signal at least at one sample point, as illustrated in FIGS. 7D, E or F, wherein the threshold level T/H is slightly lower than the maximum peak value of the probe output signal Vi (the difference therebetween is less than the predetermined value VR of Step 114).

STEP 218: The CPU 28 determines whether or not the data sequence bit read in step 208 is the first bit acquired during hih level period of the square-wave signal. If so, as when the probe is correctly calibrated (FIG. 7D or over-compensated FIG. 7F), step 220 is followed. If not so, as when the probe is under-compensated (FIG. 7E), an under-compensation routine B is entered.

STEP 220: The CPU 28 reads the next data bit of the sequence stored in acquisition memory 26.

Figure 10A:
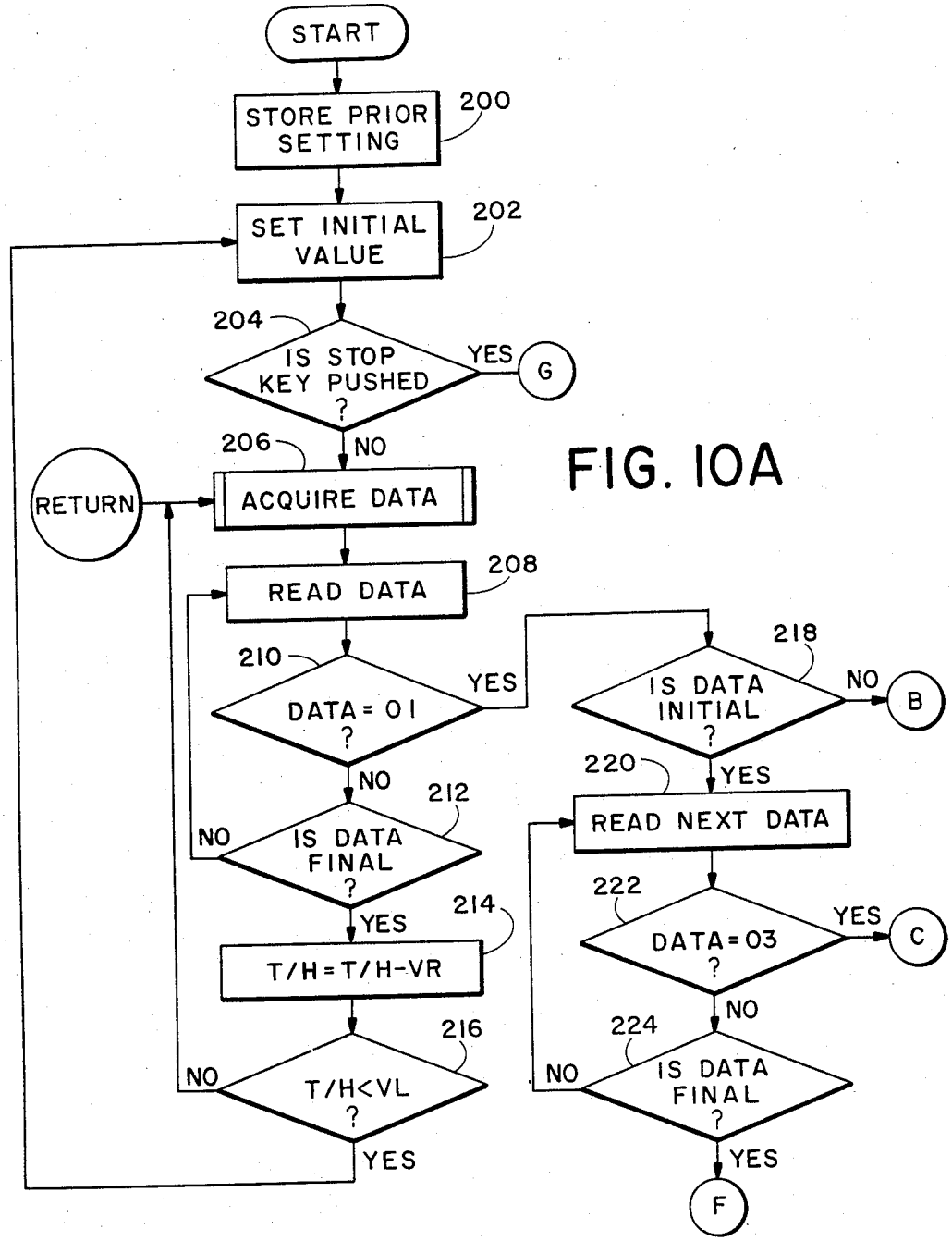
Figure 10B:
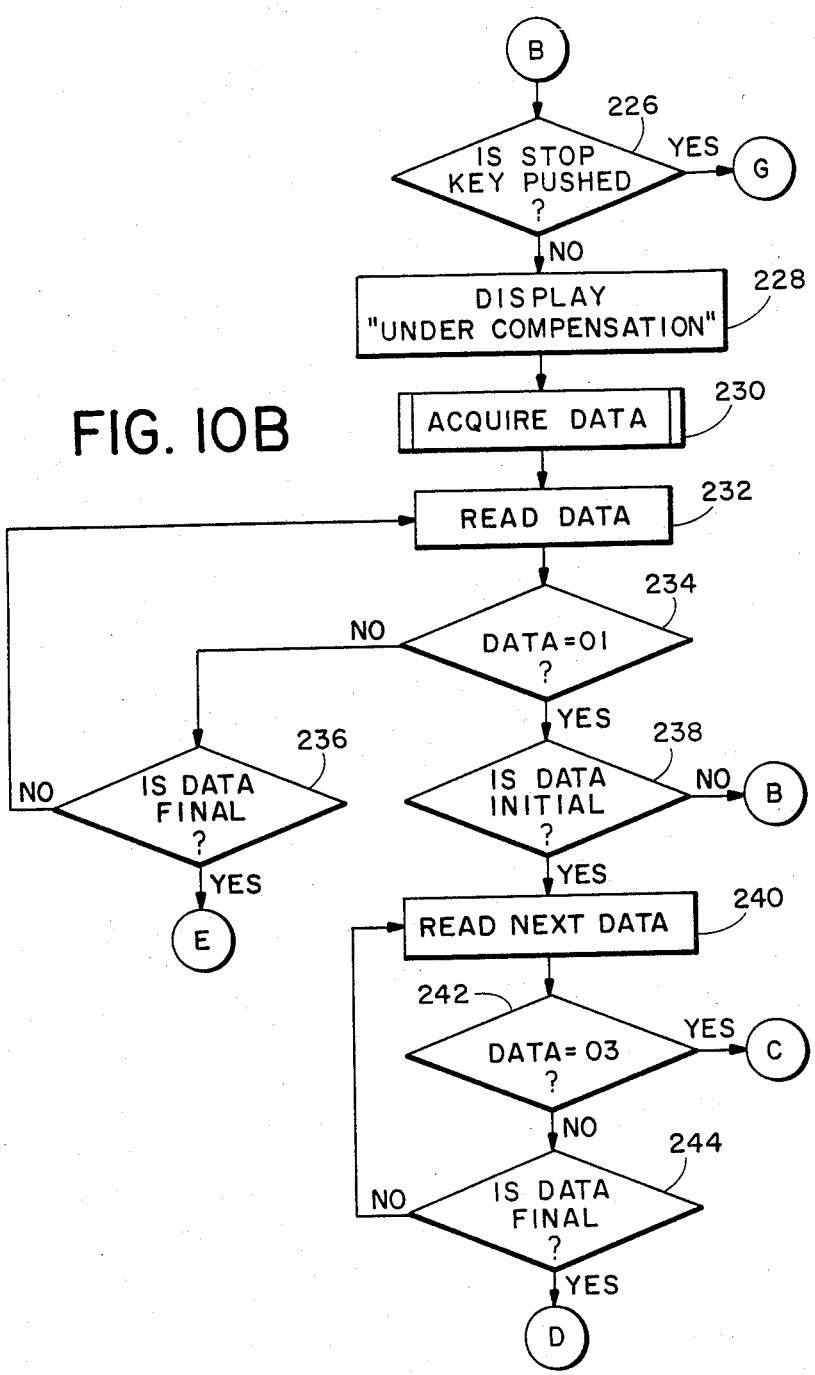
Figure 10C:
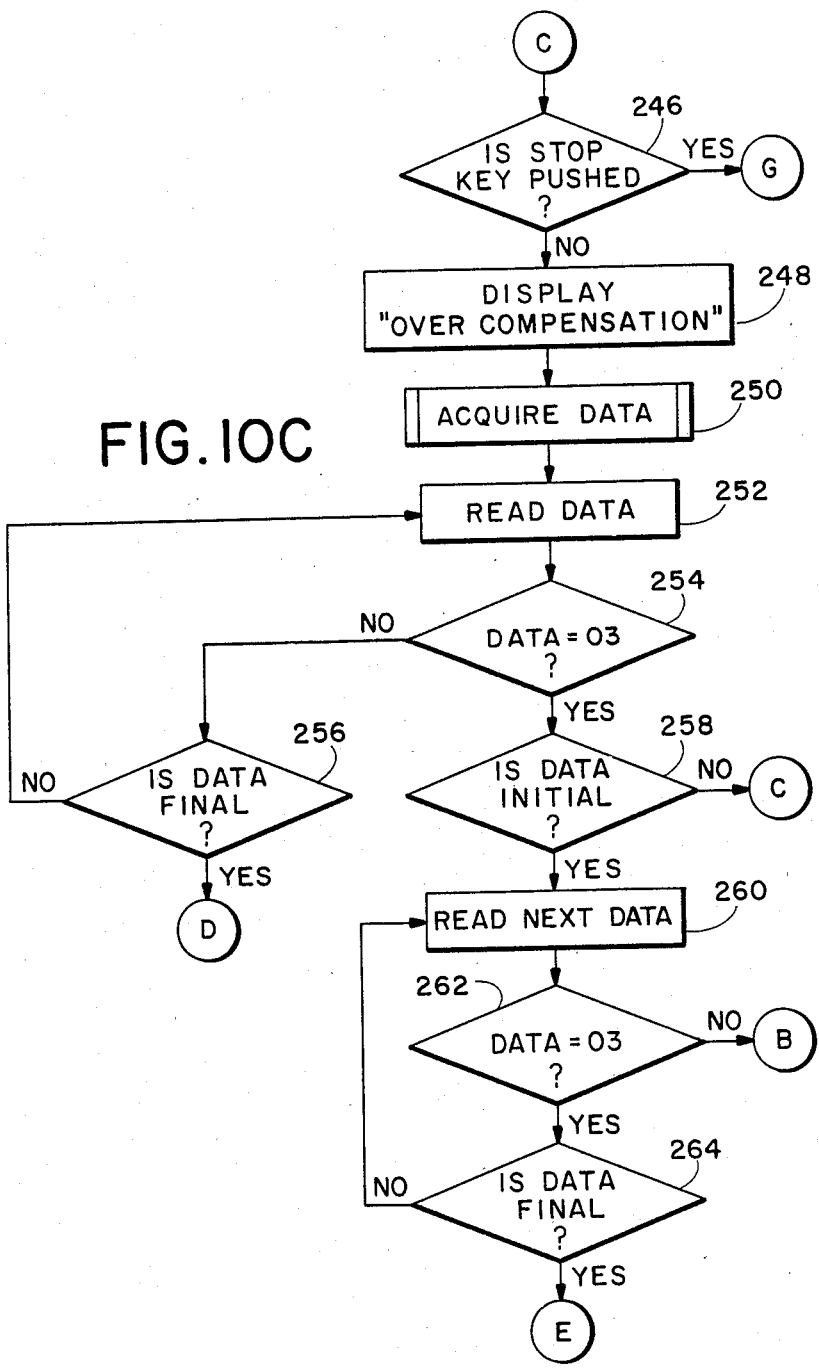

STEP 222: The CPU 28 determines whether or not the bit read in step 220 is at a low level. A low level bit indicates that the threshold level exceeds the probe output signal, and the CPU 28 references the low bit state as a code "03". If the bit is low, an over-compensation routine of FIG. 10C is provided. Otherwise step 224 is next.

STEP 224: This step is the same as step 212. A calibration routine of FIG. 10F is entered if YES, and step 220 is followed if NO.

According to steps 220-224, if the threshold level exceeds the probe output signal at only the initial portion of the period as shown in FIG. 7F, the over-compensation routine of FIG. 10C is executed. If the probe is properly compensated, i.e., the threshold level is less than the probe output signal at all sample points during the high level portion of an output signal cycle as shown in FIG. 7D, the program proceeds to the calibration routine of FIG. 10F.

The under-compensation routine will be discussed by reference to FIG. 10B:

STEP 226: This step is the same as step 204. The completion routine of FIG. 10G is executed if the result is YES, and the program proceeds to step 228 if not.

STEP 228: The CPU 28 controls the display device 35 to display "UNDER COMPENSATION", indicating that the probe is in an under-compensation condition. An operator can calibrate the probe 4 by adjusting the variable capacitors 12 and/or 14 while monitoring the display on the device 35.

STEP 230: Since an operator may have adjusted the probe calibration settings since calibration was last checked, the present condition of the probe 4 may be one of correct compensation, under-compensation or over-compensation. Therefore the data sequence is rechecked from the beginning starting with this step which is similar to step 206.

STEP 232: This step is similar to step 208, i.e., the CPU 28 reads the acquired data sequence.

STEP 234: This step is similar to step 210. Step 238 is followed if the threshold level does not exceed the probe output signal (code "01"), and step 236 if the threshold level exceeds the probe output signal (code "03").

STEP 236: This step is the same as step 212, wherein the CPU 28 determines whether or not the bit read in step 232 is the last bit of the stored sequence. If the determination result in affirmative, i.e., the threshold level is higher than the probe output signal at every sample point, a "high" routine E of FIG. 10E is executed. If the result is negative, step 232 is next.

STEPS 238-244: These steps are the same as steps 218-224 respectively except that in step 244, if the determination result is affirmative, the threshold level is lower than the probe output signal at every point and a "low" routine D of FIG. 10D is entered.

Thus the CPU 28 determines whether or not the threshold level is lower than at least a part of the probe output signal via the steps 232-236. The high routine is followed if the threshold level is not less than the probe output signal at any sample point. If the threshold level exceeds at least one point of the probe output signal, the CPU 28 determines whether the probe 4 is either in the under-compensation state or the over-compensation state. It should be noted that an affirmative result in step 244 leads to the low routine instead of the calibration routine in step 224 because noise interposed on the probe output signal may otherwise introduce an erroneous result.

The over-compensation routine will be discussed by reference to FIG. 10C:

STEP 246: This step is similar to steps 204 and 226. The completion routine G is entered if the result is YES, or step 248 if the result is NO.

STEP 248: The CPU 28 controls the display device 35 to display "OVER COMPENSATION". The operation may adjust the probe 4 by monitoring this display.

STEP 250: A new sample data sequence is stored in the acquisition memory 26. At this point, the probe output signal Vi may be either of the square-wave, under-compensated or over-compensated waveforems shown in FIGS. 7A, B and C.

STEP 252: This step is similar to steps 208 and 232; the CPU 28 reads the first data bit acquired during the high level period of the square-wave signal 10.

STEP 254: This step is similar to step 222, and the CPU 28 determines whether or not the data bit read corresponds to the code "03", i.e., whether or not the threshold level exceeds the probe output signal. The program proceeds to step 256 if the threshold level is higher than the probe output signal, step 258 if the threshold level is lower.

STEP 256: The CPU 28 determines whether or not the read data in step 252 is the final data. The low routine or step 252 is next if the determination result is YES or NO, respectively.

STEP 258: The CPU 28 determines whether or not the data bit read in step 252 is the first data bit of the sequence acquired during the high level period of the square-wave signal. If it is, the over-compensation routine C is executed. If the bit is not the first bit of the sequence, step 260 is followed.

STEP 260: The CPU 28 reads the next bit of the stored data sequence.

STEP 262: This step is similar to step 222 and 254, and the affirmative and negative results lead to step 264 or to the under-compensation routine B, respectively.

STEP 264: If the bit read in step 260 is the last bit of the stored sequence, the high routine E is followed. If not, step 260 is repeated.

Thus in steps 252-265, the CPU 28 determines whether or not the threshold level is less than the probe output signal at all sample points. If so, the low routine D is executed. If the CPU 28 detects that the threshold level exceeds the probe output at the first sample point of the sequence, then in step 258, the over-compensation routine B is followed. In step 262, if the CPU 28 determines that the threshold level exceeds the probe output at the first sample point but is less than the probe output at a subsequent sample point, the under-compensation routine B is executed. If the threshold level exceeds the probe output signal for any sample point, the high routine E is followed.

FIG. 10D is a flow chart of the low routine D. This routine is for the situation when the threshold level is less than the probe output signal at all sample points.

STEP 266: This step is similar to step 204 and the affirmative and negative results lead to the completion routine G or to step 268, respectively.

STEP 268: The CPU 28 controls the DAC 24 to increase the threshold level by a predetermined small value VR.

STEP 270: A new data sequence is acquired as in step 206.

STEP 272: The CPU 28 reads the first bit of the sequence as in step 208.

STEP 272: If the bit read in step 272 indicates that the threshold level exceeds the probe output signal, step 276 is followed. If not, step 278 is next.

STEP 276: If the data bit read in step 272 is the final bit of the stored sequence, the calibration routine F is provided. If not, step 272 is repeated to read the next bit of the sequence.

STEP 278: The CPU 28 controls the DAC 24 to decrease the threshold level by the predetermined value VR.

Thus, in the low routine D, if every sample point along the probe output signal is within a range determined by the threshold level at its setting prior to step 268, and at a slightly higher setting T/H+VR after step 268, the probe is calibrated and the compensation routine F is followed. Otherwise, the probe is not calibrated, and program flow is returned to FIG. 10A.

FIG. 10E is a flow chart of the high routine E. This routine is entered when the threshold level exceeds the probe output signal at every sample point because the level is higher than the maximum peak value of the probe output signal. Steps 280–292 of this routine correspond to steps 266–278 of FIG. 10D, respectively, except that step 288 directs flow to step 292 if the probe output exceeds the threshold level at any point, and to step 290 otherwise, and the threshold level is decreased and increased by the predetermined value VR in steps 282 and 292. In steps 290, if the threshold level exceeds the probe output signal for all sample points, i.e., if the probe output signal at each sample is within a range VR having a higher limit determined by the threshold value prior to step 282 and a lower limit determined by the threshold level following step 282, the probe is judged to be calibrated and the calibration routine F is entered. If the probe is not calibrated, program flow returns to the routine of FIG. 10A.

FIG. 10F is a flow chart of the calibration routine wherein the CPU 28 controls the display device to display "CALIBRATION", which means that the probe is calibrated, in step 294. In addition the CPU 28 controls the DAC 24 to increase the threshold level by the predetermined value VR in step 296 and the program returns to step 206 of FIG. 10A.

FIG. 10G shows a flow chart of a completion routine. The CPU 28 restores various components of the data aquisition system to their prior settings through step 298 so as to return the logic analyzer 2 to the mode in which it was operating before the probe calibration was selected.

Thus, the probe calibration condition is precisely determined through the steps illustrated in FIGS. 10A–10G of the present invention. Moreover, probe calibration is easily accomplished by adjusting the various capacitors thereof while observing the displays controlled in steps 228, 248 and 294, and stopping the adjustment after a display of "CALIBRATION" is observed. The calibration mode is completed by pushing the stop key of keyboard 33. Since the execution speed of steps 200–298 is very high, the probe adjustment need not be synchronized with these steps. As described hereinbefore, these steps are executed by the CPU 28 using the RAM 38 as temporary memory in accordance with the program stored in the ROM 37.

One example of an actual program, corresponding to steps 200–298, is shown in Appendix A. This program is in assembly language form for the above-described 8080 microprocessor.

Figure 11:
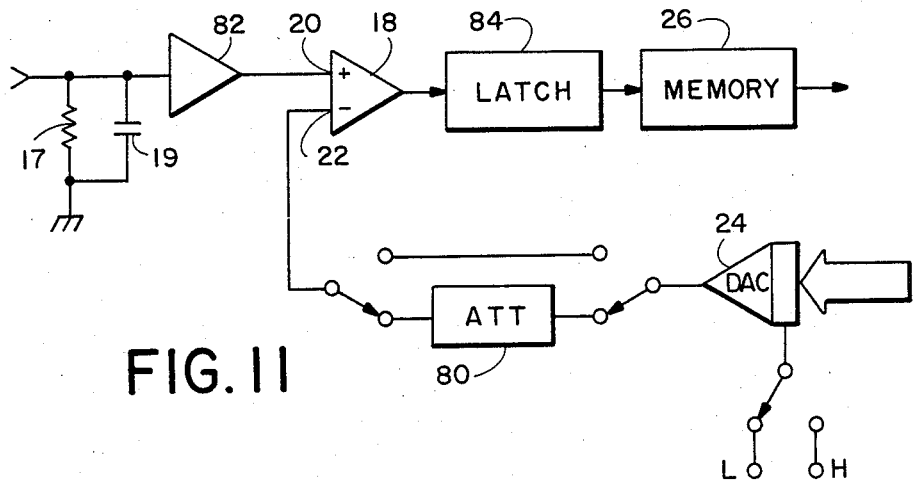
FIG. 11 is a block diagram of a part of the electrical measurement apparatus of FIG. 9.
Figure 12:
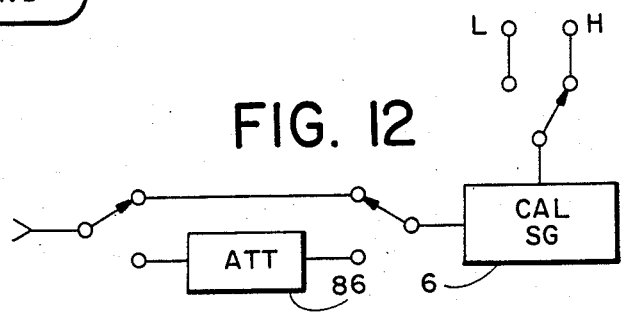
FIG. 12 is a block diagram of another part of the electrical measurement apparatus of FIG. 9.

The amplitude of the probe output signal is smaller than that of the square-wave signal 10 from the calibration signal generator 6 because the probe attenuates the signal level. For improving the operation of the comparator 18, the signal levels applied to the non-inverting and inverting input terminals of the comparator 18 can be made adjustable by modifying the logic analyzer 2 of FIGS. 1 and 9 as shown in FIGS. 11 and 12. The same reference numbers in FIGS. 11 and 12 have been employed to designate like blocks of FIGS. 1 and 9, and only the differences therebetween will be discussed.

In FIG. 11, reference number 80 indicates an attenuator, character H indicates a high voltage source, L indicates a low voltage source, 82 indicates a buffer amplifier, and 84 indicates a latch circuit. The buffer amplifier 82 may be an inverting or non-inverting amplifier. In a probe calibration mode of operation, the reference voltage terminal of the DAC 24 is connected to the low voltage source L for decreasing the output level therefrom, and the output level is applied to the inverting input terminal 22 of the comparator 18 through the attenuator 80. Thus, the threshold level applied to the comparator 18 can be changed by a very small amount. During other than in the calibration mode, the reference voltage terminal of DAC 24 is connected to the high voltage source H, and the output terminal of the DAC 24 is directly connected to the inverting input terminal of the comparator 18. The attenuator 80 may be eliminated and the output terminal of DAC 24 may be directly connected to the inverting input terminal of the comparator 18.

In FIG. 12, the reference voltage terminal of the calibration signal generator 6 is connected to the high voltage source H for increasing the amplitude of the square-wave signal, and the output terminal of the generator 6 is directly connected to the probe when the calibration mode is selected. During other than in the probe calibration mode, the reference voltage terminal of the calibration signal generator 6 is connected to the low voltage source L, and the square-wave signal from the generator 6 is attenuated by an attenuator 86 for various purposes. The attenuator 86 may also be eliminated. The modifications of FIGS. 11 and 12 are useful when the attenuation ratio of the probe is high.

As understood from the foregoing description, according to the present invention a probe calibration can be determined without using an oscilloscope and it is not necessary to know the probe condition before determining the probe calibration. If an electrical measurement apparatus already includes a CPU, a calibration signal generator and a comparator as shown in FIGS. 1 and 9, additional hardware may not be required and only additional software may be necessary for determining the calibration condition of the probe. Thus, the physical construction of the present invention is simple.

While we have shown and described herein the preferred embodiments of our invention, it will be apparent to those skilled in the art that many changes and modifications may be made without departing from our invention in its broader aspects. For example, the threshold level may be initially set at the center level of the probe output signal and progressively incremented or decremented to determine the duty factor of the square-wave signal according to the first embodiment of the invention. The calibration signal generator may be a conventional pulse generator, such as a multivibrator, or a switching circuit for alternately selecting ground level and a predetermined level. The square-wave signal from the calibration signal generator may be directly applied to the comparator for comparing with the trigger level in FIG. 9. The control device for controlling each step may be combinations of logic circuits instead of the CPU. Therefore, the scope of the present invention should be determined only by the following claims.

APPENDIX A

```
; ****************************************************************
; *  NAME      :  CMPPRB()
; *
; *  FUNCTION :
; *     TO COMPENSATE PROBE.
; *
; *  CALLED BY:
; *
; *  CALL      :            SETTHR_(),SETINP_(),           SETSMP_()
; *               SETNDL_(),SETTRM_(),SETQUL_().
; *
; *  COMMENT   : SEQUENCIALLY CALL UPPER ROUTINES.
; *
; *  UPDATE    : JUN.18 82
; *              JUL.01 82
; *              SEP.01 82
; ****************************************************************
;
        GLOBAL   SWORD$
        GLOBAL   FSTOP$
        GLOBAL   CRT$
        GLOBAL   ERASE..$
        GLOBAL   ERRPT$
        GLOBAL   AUNDER$
        GLOBAL   AFIT$
        GLOBAL   FTRGFSN$
        GLOBAL   VPTHL$
        GLOBAL   FPTHIN$
        GLOBAL   FDIAGER$
        GLOBAL   VPSAMPL$
        GLOBAL   TRGSEQ$
        GLOBAL   FSYS$
        GLOBAL   SETTHR.$
        GLOBAL   SETINP.$
        GLOBAL   SETSMP.$
        GLOBAL   SETNDL$
        GLOBAL   SETTRM$
        GLOBAL   SETQUL$
        GLOBAL   M2180F$
        GLOBAL   TRGONOF$
        GLOBAL   DATTBL$
        GLOBAL   DATMIN$
        GLOBAL   WDDATA$
        GLOBAL   WDDONTC$
        GLOBAL   FDIAGIN$
        GLOBAL   CALPRB$
CALPRB$ PUSH     D               ;
        LHLD     DATMIN$         ;
        PUSH     H               ;
        LDA      FPTHIN$+1       ;
        PUSH     PSW             ;
        LDA      FPTHIN$         ;
```

APPENDIX A CONTINUED

```
            PUSH    PSW             ;
            LDA     VPTHL$          ;
            PUSH    PSW             ;
            LHLD    SWORD$+32       ;
            PUSH    H               ;
            LDA     FTRGPSN$        ;
            PUSH    PSW             ;
            LDA     VPSAMPL$        ;
            PUSH    PSW             ;
            MVI     A,03H           ; SEQUENCE = NA FLWD B.
            STA     TRGSEQ$         ;
            MVI     A,30H           ;
            STA     TRGONOF$        ;
            MVI     A,09H           ;
            STA     VPSAMPL$        ;
            MVI     C,12            ;
            LXI     H,WDDATA$       ;
CLR         XRA     A               ;
            MOV     M,A             ;
            DCR     C               ;
            MOV     A,C             ;
            ORA     A               ;
            JZ      WDO             ;
            INX     H               ;
            JMP     CLR             ;
WDO         MVI     C,12            ;
            LXI     H,WDDONTC$      ;
CLR1        MVI     A,0FFH          ;
            MOV     M,A             ;
            DCR     C               ;
            MOV     A,C             ;
            ORA     A               ;
            JZ      WD              ;
            INX     H               ;
            JMP     CLR1            ;
WD          LDA     FSYS$           ;
            ORA     A               ;
            JNZ     SYS338          ;
            MVI     A,00H           ;
            STA     WDDATA$+3       ;
            INR     A               ;
            STA     WDDATA$+4       ;
            MVI     A,0FEH          ;
            STA     WDDONTC$+3      ;
            STA     WDDONTC$+4      ;
            JMP     SETDLY          ;
SYS338      MVI     A,00H           ;
            STA     WDDATA$         ;
            INR     A               ;
            STA     WDDATA$+1       ;
            MVI     A,0FEH          ;
            STA     WDDONTC$        ;
            STA     WDDONTC$+1      ;
SETDLY      MVI     A,0FAH          ;
            STA     FTRGPSN$        ;
            LXI     H,0FAH          ;
            SHLD    SWORD$+32       ;
BGNO        MVI     A,66H           ;
            STA     VPTHL$          ;
            MVI     A,00H           ;
            STA     FPTHIN$         ;
            MVI     A,01H           ;
            STA     FPTHIN$+1       ;
```

APPENDIX A CONTINUED

```
            CALL    M2180F$         ;
            CALL    SETINP.$        ;
            LXI     H,268           ;
            PUSH    H               ;
            LXI     H,260           ;
            PUSH    H               ;
            CALL    ERASE..$        ;
            POP     PSW             ;
            POP     PSW             ;
            XRA     A               ;
            STA     FDIAGIN$        ;
BGN         LDA     FSTOP$          ;
            ORA     A               ;
            JNZ     FNSH            ;
            CALL    READ            ;
LOOP1       MOV     A,M             ;
            CPI     01H             ;
            JZ      CHKALLH         ;
            INX     H               ;
            INR     B               ;
            MOV     A,B             ;
            ORA     A               ;
            JNZ     LOOP1           ;
            LXI     H,VPTHL$        ;
            MOV     A,M             ; SET T/H -4 STEPS.
            SUI     04H             ;
            MOV     M,A             ;
            MOV     A,M             ;/*
            CPI     40H             ; RETRY TO SEARCH T/H LEVEL.
            JC      BGNO            ;*/
            JMP     BGN             ;
CHKALLH     MOV     A,B             ;/*
            CPI     0C5H            ;
            JNZ     UNDER           ;
CHKOVER     MOV     A,M             ; CHECK ALL HIGH.
            CPI     03H             ;
            JZ      OVER            ;
            INR     B               ;
            MOV     A,B             ;
            ORA     A               ;
            JZ      FIT             ;
            INX     H               ;
            JMP     CHKOVER         ;
FIT         LXI     H,AFIT$         ;DISPLAY FIT
            LXI     B,4803H         ;
            CALL    MSG             ;
            LXI     H,VPTHL$        ;
            MOV     A,M             ;
            ADI     04H             ;
            MOV     M,A             ;
            JMP     BGN             ;
UNDER       LDA     FSTOP$          ;
            ORA     A               ;
            JNZ     FNSH            ;
            LXI     H,AUNDER$       ;DISPLAY UNDER
            LXI     B,4805H         ;
            CALL    MSG             ;
            CALL    READ            ;
LOOP2       MOV     A,M             ;
            CPI     01H             ;
            JNZ     LOOP21          ;
            MOV     A,B             ;
            CPI     0C5H            ;
            JNZ     UNDER           ;
```

APPENDIX A CONTINUED

```
            INR     B               ;
            INX     H               ;/*
LOOP22      MOV     A,M             ;
            CPI     01H             ;
            JNZ     OVER            ; CHECK ALL HIGH DATA ?
            INX     H               ;
            INR     B               ;
            MOV     A,B             ;
            ORA     A               ;
            JNZ     LOOP22          ;*/
            JMP     ALLL            ;
LOOP21      INX     H               ;
            INR     B               ;
            MOV     A,B             ;
            ORA     A               ;
            JNZ     LOOP2           ;
            JMP     ALLH            ;
ALLL        LDA     FSTOP$          ;/*
            ORA     A               ;
            JNZ     FNSH            ;
            LXI     H,VPTHL$        ;
            MOV     A,M             ;
            ADI     04H             ;
            MOV     M,A             ;
            CALL    READ            ; CHECK ALL LOW DATA.
LOOP3       MOV     A,M             ;
            CPI     03H             ;
            JNZ     RETRY1          ;
            INX     H               ;
            INR     B               ;
            MOV     A,B             ;
            ORA     A               ;
            JNZ     LOOP3           ;
            JMP     FIT             ;
ALLH        LDA     FSTOP$          ;
            ORA     A               ;
            JNZ     FNSH            ;
            LXI     H,VPTHL$        ;
            MOV     A,M             ;
            SUI     04H             ;
            MOV     M,A             ;
            CALL    READ            ;
LOOP31      MOV     A,M             ;
            CPI     01H             ;
            JNZ     RETRY           ;
            INR     B               ;
            INX     H               ;
            MOV     A,B             ;
            ORA     A               ;
            JNZ     LOOP31          ;
            JMP     FIT             ;
RETRY       LXI     H,VPTHL$        ;
            MOV     A,M             ;
            ADI     04H             ;
            MOV     M,A             ;
            JMP     BGN             ;
RETRY1      LXI     H,VPTHL$        ;
            MOV     A,M             ;
            SUI     04H             ;
            MOV     M,A             ;
            JMP     BGN             ;
OVER        LDA     FSTOP$          ;
            ORA     A               ;
```

APPENDIX A CONTINUED

```
            JNZ     FNSH            ;
            LXI     H,ERRPT$+30     ;DISPLAY OVER
            LXI     B,4804H         ;
            CALL    MSG             ;
            CALL    READ            ;
LOOP4       MOV     A,M             ;
            CPI     03H             ;
            JNZ     LOOP41          ;
            MOV     A,B             ;
            CPI     0C5H            ;
            JNZ     OVER            ;
            INX     H               ;
            INR     B               ;
LOOP42      MOV     A,M             ;
            CPI     03H             ;
            JNZ     UNDER           ;
            INX     H               ;
            INR     B               ;
            MOV     A,B             ;
            ORA     A               ;
            JNZ     LOOP42          ;
            JMP     ALLH            ;
LOOP41      INX     H               ;
            INR     B               ;
            MOV     A,B             ;
            ORA     A               ;
            JNZ     LOOP4           ;
            JMP     ALLL            ;
TEST        XRA     A               ;
            STA     FDIAGER$        ;
            CALL    M2180F$         ;
            OUT     57H             ;
            IN      5DH             ;
            CALL    SETTHR.$        ;
            CALL    SETNDL$         ;
            MVI     A,02H           ;/*
            OUT     50H             ;
            MVI     A,12H           ; MODIFY ON APL. 02 /82
            OUT     51H             ;
            CALL    INHQU1          ;
            MVI     A,0FFH          ;
            OUT     55H             ;
            MVI     A,1FH           ;
            OUT     51H             ;
            OUT     57H             ;*/
            CALL    SETTRM$         ;
            CALL    SETQUL$         ;
            MVI     A,00H           ;SELECT ALL CSs
            OUT     5AH             ;WRITE CSs,
            LDA     FSYS$           ;
            ORA     A               ;
            JNZ     SET338          ;
            XRA     A               ;
            OUT     01H             ;
            CMA                     ;
            OUT     01H             ;
            OUT     01H             ;
            OUT     01H             ;
            CMA                     ;
            OUT     01H             ;
            JMP     SMPL            ;
SET338      MVI     A,0FFH          ;
            OUT     03H             ;
            XRA     A               ;
```

APPENDIX A CONTINUED

```
            OUT     03H             ;
            OUT     03H             ;
            CMA                     ;
            OUT     03H             ;
            OUT     03H             ;
            CMA                     ;
            OUT     03H             ;
SMPL        CALL    SETSMP.$
            OUT     57H
            LDA     FDIAGER$
            ORA     A
            JZ      NEXT
            MVI     A,0FEH          ;/*
            OUT     40H             ;
            OUT     53H             ;
            OUT     46H             ;
            OUT     57H             ;
            IN      5DH             ;
            OUT     5FH             ; MANUAL STOP.
            RET                     ;/*
NEXT        MVI     A,0FEH          ;
            OUT     40H             ;
            IN      5DH             ;
            OUT     5FH             ;
            OUT     57H             ;
            OUT     46H             ;
            OUT     56H             ;START UP.
            RET
READ        CALL    TEST            ;/*
LOOP        LDA     FDIAGER$        ;
            ORA     A               ;
            RNZ                     ;
            IN      5DH             ;
            RRC                     ;
            RRC                     ;
            RRC                     ;
            RRC                     ;
            JNC     LOOP            ;
            IN      5DH             ;
            RRC                     ;
            RRC                     ;
            RRC                     ;
            JC      LOOP            ;
            IN      5DH             ;
            RLC                     ;
            JNC     LOOP            ;
            CALL    RDDATA          ;
            MVI     B,0C5H          ;
            LDA     FSYS$           ;
            ORA     A               ;
            JNZ     RD338           ;
            LXI     H,DATTBL$+261   ;
            RET                     ;
RD338       LXI     H,DATTBL$+5     ;
            RET
MSG         PUSH    H               ;
            PUSH    B               ;
            LXI     H,268           ;
            PUSH    H               ; DISPLAY STATUS MESSAGES.
            LXI     H,260           ;
            PUSH    H               ;
            CALL    ERASE..$        ;
            POP     PSW             ;
            POP     PSW             ;
```

APPENDIX A CONTINUED

```
              POP     B              ;
              POP     H              ;
              LXI     D,CRT$+260     ;
LOOP5         MOV     A,M            ; DISPLAY CHARACTER.
              STAX    D              ;
              INX     D              ;
              MOV     A,B            ; DISPLAY CONTROL CODE.
              STAX    D              ;
              INX     D              ;
              INX     H              ;
              DCR     C              ; THE NUMBER OF CHARACTERS.
              MOV     A,C            ;
              ORA     A              ;
              JNZ     LOOP5          ;
              RET
RDDATA        CALL    M2180F$
              MVI     A,03H          ;ADD ON 25-MAY-82
              OUT     48H            ; SET CPU CLOCK.
              MVI     A,02H          ;/*
              OUT     50H            ;
              CALL    INHQUL         ;
              LXI     H,00H          ;
NOCARRY       IN      5DH            ;/*
              RLC                    ; DETECT ADDRESS COUNTER
              RLC                    ;    CARRY FLAG.
              JC      CARRY          ;*/
              MVI     A,0FFH         ;
              OUT     55H            ;COUNTS UP ADDRESS COUNTER.
              INX     H              ;COUNTS UP BAD DATA.
              JMP     NOCARRY
              ;
CARRY         SHLD    DATMIN$        ;DEFINE THE NUMBER OF BAD DATA.
              MOV     B,L            ;
              MVI     A,0FFH         ; SET ( 0FFH - BAD DATA ).
              SUB     B              ;
              MOV     B,A            ;*/
              MVI     C,0C0H         ; SET THE NUMBER OF DATA.
              XRA     A              ;/*
              OUT     50H            ;
              MVI     A,10H          ;
              OUT     51H            ;
              MVI     A,0FFH         ;
              OUT     58H            ;
              OUT     5BH            ;
              MVI     A,01H          ;
              OUT     50H            ;
              CALL    INHQUL         ;   MOD JUN 14.
              ;                      ; */
              LDA     FSYS$          ;
              ORA     A              ;
              JZ      SET318         ;
              LXI     H,DATTBL$      ;/*
              MVI     A,1EH          ;. SELECT CS0 AND READ FOR POD A
              CALL    READ1          ;*/
              RET
SET318        LXI     H,DATTBL$+256  ;
              MVI     A,1DH          ;/* SELECT CS1 AND READ FOR POD B
              CALL    READ1          ;*/
              RET
              ;
READ1         OUT     5AH            ; SELECT CSi
              MOV     A,B
LOOP7         ORA     A              ;/*
```

APPENDIX A CONTINUED

```
         JZ      ACQ1            ;COUNTS UP FOR BAD DATA.
         MOV     E,A             ;
         MVI     A,0FFH          ;
         OUT     55H             ;
         MOV     A,E             ;
         DCR     A               ;
         JMP     LOOP7           ;*/
         ;
ACQ1     MVI     A,0FFH          ;
         OUT     55H
ACQ      IN      59H             ;/*
         ANI     03H             ;
         MOV     M,A             ;
         INX     H               ;
         MVI     A,0FFH          ;
         OUT     55H             ;
         INR     C               ; READ DATA FROM HSACQ TO ACQ.
         MOV     A,C             ;
         ORA     A               ;
         JNZ     ACQ             ;*/
         RET
INHQUL   MVI     A,10H           ;/*
         OUT     51H             ;
INHQU1   MVI     A,0FFH          ;
         OUT     58H             ;
         MVI     A,05H           ; MOD JUN 14.
         OUT     50H             ;
         MVI     A,3FH           ;
         OUT     51H             ;
         MVI     A,0FFH          ;
         OUT     52H             ;
         OUT     54H             ;
         OUT     53H             ;*/
         RET
FNSH     POP     PSW             ;
         STA     VPSAMPL$        ;
         POP     PSW             ;
         STA     FTRGPSN$        ;
         POP     H               ;
         SHLD    SWORD$+32       ;
         POP     PSW             ;
         STA     VPTHL$          ;
         POP     PSW             ;
         STA     FPTHIN$         ;
         POP     PSW             ;
         STA     FPTHIN$+1       ;
         POP     H               ;
         SHLD    DATMIN$         ;
         POP     D               ;
         RET                     ;
```

What we claim as being novel is:

1. A method of testing probe calibration, comprising the steps of:

applying a square-wave signal to a probe to be tested;

adjusting a reference level to be within a selected range of a peak level of an output signal from said probe;

comparing the reference level with the magnitude of the output signal from said probe; and determining whether a duty factor of the probe output signal is equal to a known duty factor of the square-wave signal, said duty factor of said output signal being determined in response to said comparison according to the duration of said probe output signal which exceeds said reference level in magnitude;

wherein said probe is determined to be calibrated when the duty factors of the probe output signal and the square-wave signal are equal to each other.

2. A method of testing a probe calibration according to claim 1, wherein the reference level is adjusted to a level lower than the maximum peak level of the output signal from the probe by an amount according to which the known duty factor of said square-wave signal can be determined.

3. A method of testing a probe calibration according to claim 2, wherein the reference level is adjusted by decreasing said reference level until a portion of said probe output signal exceeds said reference level in magnitude.

4. A method of testing a probe calibration according to claim 1, wherein the reference level is adjusted to a level higher than the minimum peak level of the output signal from the probe by an amount according to which the known duty factor of said square-wave signal can be determined.

5. A method of testing a probe calibration according to claim 4, wherein the reference level is adjusted by increasing said reference level until a portion of said probe output signal is less than said reference level in magnitude.

6. A method of testing probe calibration according to claim 1 further including the step of:
displaying an indication as to whether said probe is calibrated.

7. A probe calibration testing apparatus, comprising:
means for generating a square-wave signal to be applied to a probe;
means for generating a variable reference level;
means for comparing an output signal from said probe with the reference level and for producing an output signal indicating whether or not the probe output signal exceeds the reference level; and
control means for controlling said reference level to a level within a selected range of a peak level of the probe output signal, and for determining whether said probe is calibrated by repeatedly sampling the output signal from said comparison means.

8. A probe calibration testing apparatus according to claim 7, wherein said control means controls the reference level to be lower than the maximum peak level of the output signal from said probe by an amount according to which a known duty factor of said square-wave signal can be determined, detects the duty factor of said probe output signal according to the states of said comparison means output signal, and determines said probe to be calibrated when the duty factor of the probe output signal is equal to that of the square-wave signal.

9. A probe calibration testing apparatus according to claim 7, wherein said control means controls the reference level to be higher than the minimum level of the output signal from said probe by an amount according to which a known duty factor of said square-wave signal can be determined, detects the duty factor of said probe output signal according to the states of said comparison means output signal, and determines said probe to be calibrated when the duty factor of the probe output signal is equal to that of the square-wave signal.

10. A probe calibration testing apparatus according to claim 7, wherein said control means controls the reference level to first and second levels higher and lower than a peak level of the output signal from said probe, and determines said probe is calibrated when the output signal of the means for comparing indicates that the output signal from said probe is less than the first level and greater than said second level during a selected portion of said probe output signal.

11. A probe calibration testing apparatus according to claim 7 wherein said signal generation means comprises a pulse generator.

12. A probe calibration testing apparatus according to claim 7 wherein said reference level generation means comprises a digital-to-analog converter.

13. A probe calibration testing apparatus according to claim 7 wherein said control means comprises a microprocessor system.

14. A probe calibration testing apparatus according to claim 7, further including a display device for displaying the calibration determination result of said control means.

15. A method of testing calibration of a probe comprising the steps of:
applying a known square-wave signal having a known duty factor to the probe to generate a probe output signal;
determining a duty factor of said probe output signal by comparing said probe output signal to a reference level and detecting the relative proportion of the probe output signal exceeding the reference level; and
determining the probe to be calibrated when a probe output signal duty factor substantially matches said known duty factor of said square-wave signal.

16. A method of testing calibration of a probe comprising the steps of:
applying a square-wave signal to the probe to generate a probe output signal, each cycle of said square-wave signal having a high voltage portion and a low voltage portion;
generating a reference voltage level higher than the highest magnitude of said probe output signal during a given portion of each cycle thereof generated in response to the high voltage portion of each corresponding cycle of said square-wave signal;
successively decreasing said reference level by a selected amount and comparing said probe output signal magnitude with each successively decreased reference level during said given portion of said output signal generated in response to said high voltage square-wave cycle portion until said probe output signal magnitude exceeds said reference level of at least a part of its said given portion; and
determining said probe to be calibrated if said probe output signal magnitude exceeds said reference level during substantially all of its said given portion.

17. A method of testing calibration of a probe according to claim 16 further comprising the step of:
determining said probe to be overcompensated if the output signal magnitude is greater than said reference level during a first part of said given portion and less than said reference level during a subsequent part of said given portion.

18. A method of testing calibration of a probe according to claim 16 further comprising the step of:
determining said probe to be undercompensated if the output signal magnitude is less than said reference level during a first part of said given portion and greater than said reference level during a subsequent part of said given portion.

19. A method of testing calibration of a probe according to claim 16 further comprising the steps of:
determining said probe to be overcompensated if the output signal magnitude is greater than said reference level during a first part of said given portion and less than said reference level during a subsequent part of said given portion; and
determining said probe to be undercompensated if the output signal magnitude is less than said reference level during a first part of said given portion and greater than said reference level during a subsequent part of said given portion.

20. A method of testing calibration of a probe comprising the steps of:
   applying a square-wave signal to the probe to generate a probe output signal, each cycle of said square-wave signal having a high voltage portion and a low voltage portion;
   generating a reference voltage level lower than the lowest magnitude of said probe output signal during a given portion of each cycle thereof generated in response to the high voltage portion of each corresponding cycle of said square-wave signal;
   successively increasing said reference level by a selected amount and comparing said probe output signal magnitude with each successively increased reference level during said given portion of said output signal generated in response to said high voltage square-wave cycle portion until said probe output signal magnitude is less than said reference level for at least a part of its said given portion; and
   determining said probe to be calibrated if said probe output signal magnitude is less than the last said reference level during substantially all of said given portion.

21. A method of testing calibration of a probe comprising the steps of:
   applying a square-wave signal to the probe to generate a probe output signal, each cycle of said square-wave signal having a high voltage portion and a low voltage portion;
   generating a reference voltage level higher than the highest magnitude of said probe output signal during a given portion of each cycle thereof generated in response to the low voltage portion of each corresponding cycle of said square-wave signal;
   successively decreasing said reference level by a selected amount and comparing said probe output signal magnitude with each successively decreased reference level during said given portion of said output signal generated in response to said low voltage square-wave cycle portion until said probe output signal magnitude exceeds said reference level for at least a part of its said given portion; and
   determining said probe to be calibrated if said probe output signal magnitude exceeds the last said reference level during substantially all of its said given portion.

22. A method of testing calibration of a probe comprising the steps of:
   applying a square-wave signal to the probe to generate a probe output signal, each cycle of said square-wave signal having a high voltage portion and a low voltage portion;
   generating a reference voltage level lower than the lowest magnitude of said probe output signal during a given portion of each cycle thereof generated in response to the low voltage portion of each corresponding cycle of said square-wave signal;
   successively increasing said reference level by a selected amount and comparing said probe output signal magnitude with each successively increased reference level during said given portion of said output signal generated in response to said low voltage sqaure-wave cycle portion until said probe output signal magnitude is less than said reference level for at least a part of its said given portion; and
   determining said probe to be calibrated if said probe output signal magnitude is less than said reference level during substantially all of its said given portion.

* * * * *